(12) United States Patent
Moon

(10) Patent No.: US 10,727,364 B2
(45) Date of Patent: Jul. 28, 2020

(54) SOLAR CELL MODULE

(71) Applicant: LG ELECTRONICS INC., Seoul (KR)

(72) Inventor: Kangseok Moon, Seoul (KR)

(73) Assignee: LG Electronics Inc., Seoul (KR)

(*) Notice: Subject to any disclaimer, the term of this patent is extended or adjusted under 35 U.S.C. 154(b) by 199 days.

(21) Appl. No.: 15/615,120

(22) Filed: Jun. 6, 2017

(65) Prior Publication Data

US 2017/0358693 A1 Dec. 14, 2017

(30) Foreign Application Priority Data

Jun. 14, 2016 (KR) .................. 10-2016-0073738

(51) Int. Cl.
*H01L 31/05* (2014.01)
*H01L 31/048* (2014.01)
(Continued)

(52) U.S. Cl.
CPC .... *H01L 31/0508* (2013.01); *H01L 31/02008* (2013.01); *H01L 31/02167* (2013.01);
(Continued)

(58) Field of Classification Search
CPC ............. H01L 31/02008; H01L 31/048; H01L 31/022425; H01L 31/05–0512;
(Continued)

(56) References Cited

U.S. PATENT DOCUMENTS 5,391,235 A * 2/1995 Inoue ................ H01L 31/03921
136/244
7,122,398 B1 10/2006 Pichler
(Continued)

FOREIGN PATENT DOCUMENTS

CN 101483204 A 7/2009
EP 2897179 7/2015
(Continued)

OTHER PUBLICATIONS

Office Action in Chinese Application No. 201710441809.1, dated Sep. 7, 2018, 27 pages (with English Translation).
(Continued)

*Primary Examiner* — Lindsey A Bernier
(74) *Attorney, Agent, or Firm* — Fish & Richardson P.C.

(57) ABSTRACT

A solar cell module includes a plurality of compound semiconductor solar cells each including a compound semiconductor substrate, a first electrode part on a front surface of the compound semiconductor substrate, an insulating substrate positioned at a back surface of the compound semiconductor substrate, a second electrode part positioned between the back surface of the compound semiconductor substrate and a front surface of the insulating substrate, and an insulating adhesive attaching the insulating substrate to the second electrode part; a conductive connection member electrically connecting two adjacent compound semiconductor solar cells to each other; a conductive adhesive attaching the conductive connection member to a corresponding electrode part of the compound semiconductor solar cell; a front substrate positioned on the compound semiconductor solar cells; and a back substrate positioned below the compound semiconductor solar cells.

20 Claims, 16 Drawing Sheets

(51) Int. Cl.
*H01L 31/0735* (2012.01)
*H01L 31/073* (2012.01)
*H01L 31/0749* (2012.01)
*H01L 31/056* (2014.01)
*H01L 31/054* (2014.01)
*H01L 31/02* (2006.01)
*H01L 31/0216* (2014.01)
*H01L 31/0224* (2006.01)
*H02S 40/22* (2014.01)

(52) U.S. Cl.
CPC .... *H01L 31/022425* (2013.01); *H01L 31/048* (2013.01); *H01L 31/0504* (2013.01); *H01L 31/056* (2014.12); *H01L 31/0512* (2013.01); *H01L 31/0547* (2014.12); *H01L 31/073* (2013.01); *H01L 31/0735* (2013.01); *H01L 31/0749* (2013.01); *H02S 40/22* (2014.12); *Y02E 10/52* (2013.01); *Y02E 10/541* (2013.01); *Y02E 10/543* (2013.01); *Y02E 10/544* (2013.01)

(58) Field of Classification Search
CPC . H01L 31/0547; H01L 31/056; Y02E 10/541; Y02E 10/543; Y02E 10/544
See application file for complete search history.

(56) References Cited

U.S. PATENT DOCUMENTS

| | | | |
|---|---|---|---|
| 2003/0116185 A1* | 6/2003 | Oswald | H01L 31/02008 136/251 |
| 2008/0223436 A1* | 9/2008 | den Boer | H01L 31/022466 136/256 |
| 2010/0275969 A1 | 11/2010 | Chan et al. | |
| 2012/0042924 A1* | 2/2012 | Lee | H01L 31/02013 136/244 |
| 2012/0199173 A1* | 8/2012 | Bartholomeusz | H01L 31/0326 136/244 |

FOREIGN PATENT DOCUMENTS

| | | |
|---|---|---|
| JP | H06196743 | 7/1994 |
| JP | 2009049389 A | 3/2009 |
| JP | 2011222629 A | 11/2011 |
| JP | 2013016358 A | 1/2013 |
| JP | 20135094 | 3/2013 |
| JP | 2013509454 | 3/2013 |
| KR | 10-2014-0098305 | 8/2014 |
| KR | 101542003 | 8/2015 |
| KR | 10-2015-0100146 | 9/2015 |
| WO | 2008136872 | 11/2008 |
| WO | 2008139479 | 11/2008 |

OTHER PUBLICATIONS

Extended European Search Report in European Application No. 17174962.5, dated Nov. 3, 2017, 11 pages (with English translation).

* cited by examiner

SOLAR CELL MODULE

CROSS-REFERENCE TO RELATED APPLICATION

This application claims priority to and the benefit of Korean Patent Application No. 10-2016-0073738 filed in the Korean Intellectual Property Office on Jun. 14, 2016, the entire contents of which are incorporated herein by reference.

TECHNICAL FIELD

This application relates to a solar cell module.

BACKGROUND

A compound semiconductor is not made of a single element such as silicon (Si) and germanium (Ge) and is formed by a combination of two or more kinds of elements to operate as a semiconductor. Various kinds of compound semiconductors have been currently developed and used in various fields. The compound semiconductors are typically used for a light emitting element, such as a light emitting diode and a laser diode, and a solar cell using a photoelectric conversion effect, a thermoelectric conversion element using a Peltier effect, and the like.

A compound semiconductor solar cell uses a compound semiconductor in a light absorbing layer that absorbs solar light and generates electron-hole pairs. The light absorbing layer is formed using a III-V compound semiconductor such as GaAs, InP, GaAlAs and GaInAs, a II-VI compound semiconductor such as CdS, CdTe and ZnS, a compound semiconductor such as $CuInSe_2$, and the like.

A plurality of compound semiconductor solar cells each having the above-described configuration is connected in series or in parallel to configure a solar cell module.

FIG. 1 schematically illustrates a configuration of a compound semiconductor solar cell according to a related art.

A compound semiconductor solar cell shown in FIG. 1 includes a back electrode 10 formed of a metal layer, a semiconductor layer 20 formed on the back electrode 10, and a plurality of grid electrodes 30 formed on the semiconductor layer 20. The semiconductor layer 20 is formed of a compound semiconductor and is partially removed to expose one end (a right end in FIG. 1) of the back electrode 10.

The adjacent compound semiconductor solar cells each having the above-described configuration are connected to each other in series and/or in parallel in the solar cell module. For example, as shown in FIG. 2, one end of a conductive connection member 40 is attached to a back electrode 10 of a first solar cell by soldering, and the other end of the conductive connection member 40 is attached to a grid electrode 30 of a second solar cell by soldering. Thus, the plurality of solar cells is connected in series.

However, because the soldering for attaching the conductive connection member 40 to the corresponding electrode is performed at a high temperature, the semiconductor layer 20 may be deformed by heat generated in an attachment process using the soldering.

The back electrode 10 and the grid electrode 30 respectively attached to both ends of the conductive connection member 40 are respectively disposed at a front surface and a back surface of the semiconductor layer 20 with the semiconductor layer 20 interposed therebetween. Therefore, it is difficult to perform the attachment process using the conductive connection member 40 due to a height difference between the back electrode 10 and the grid electrode 30.

SUMMARY

Accordingly, an object of the present disclosure is to provide a solar cell module including compound semiconductor solar cells capable of addressing the above-described and other problems.

In one aspect, there is a provided a solar cell module including a plurality of compound semiconductor solar cells each including a compound semiconductor substrate including a light absorbing layer, a first electrode part positioned on a front surface of the compound semiconductor substrate, an insulating substrate that is positioned at a back surface of the compound semiconductor substrate and supports the compound semiconductor substrate, a second electrode part that is positioned between the back surface of the compound semiconductor substrate and a front surface of the insulating substrate and is extended to an outside of an end of the compound semiconductor substrate, and an insulating adhesive attaching the insulating substrate to the second electrode part; a conductive connection member electrically connecting two adjacent compound semiconductor solar cells to each other; a conductive adhesive attaching the conductive connection member to a corresponding electrode part of the compound semiconductor solar cell, the conductive adhesive including a low temperature curable paste; a front substrate positioned on the plurality of compound semiconductor solar cells; and a back substrate positioned below the plurality of compound semiconductor solar cells.

The low temperature curable paste may include a resin cured at a temperature of 180° C. or lower and a plurality of conductive particles dispersed in the resin. The resin may include an epoxy-based resin or a silicone-based resin, and the conductive particles may include at least one of Ag, SnBi, Ni and Cu.

The insulating substrate may be formed of a polymer having a thickness of 10 μm to 300 μm. The polymer may be at least one of polyethylene terephthalate (PET), polyimide (PI), or polyethylene naphthalate (PEN).

The compound semiconductor substrate may be a GaAs substrate having a thickness of 1 μm to 10 μm.

The second electrode part may be extended to the outside of the end of the compound semiconductor substrate by 0.1 mm to 5 mm.

The conductive adhesive may include a first adhesive attaching the conductive connection member to the first electrode part and a second adhesive attaching the conductive connection member to the second electrode part. At least one of a thickness and a width of the first adhesive may be different from at least one of a thickness and a width of the second adhesive.

For example, the first adhesive and the second adhesive may have different thicknesses, or may have different widths. The first adhesive and the second adhesive may have different thicknesses and different widths.

When the first adhesive and the second adhesive have different thicknesses, a thickness of the second adhesive may be greater than a thickness of the first adhesive.

In this instance, the thickness of the second adhesive may be substantially the same as a sum of a thickness of the compound semiconductor substrate, a thickness of the first electrode part, and the thickness of the first adhesive.

However, the thickness of the second adhesive may be less than a sum of the thickness of the compound semiconductor substrate, the thickness of the first electrode part, and the thickness of the first adhesive. On the contrary, the thickness of the second adhesive may be greater than a sum of the thickness of the compound semiconductor substrate, the thickness of the first electrode part, and the thickness of the first adhesive.

The first adhesive and the second adhesive may be applied to a corresponding electrode part by a printing method. In this instance, the first adhesive may be formed by one printing process, and the second adhesive may be formed by a plurality of printing processes.

Alternatively, each of the first adhesive and the second adhesive may be formed by a plurality of printing processes, and the number of printing processes of the second adhesive may be more than the number of printing processes of the first adhesive.

Further, when the first adhesive and the second adhesive have different widths, a width of the first adhesive may be greater than a width of the second adhesive.

In this instance, when the first adhesive and the second adhesive are applied in the same amount to each other, the first adhesive may be spread more than the second adhesive by a pressure applied to the conductive connection member in a process for attaching the first adhesive to the conductive connection member and a process for attaching the second adhesive to the conductive connection member. Hence, the width of the first adhesive may be greater than the width of the second adhesive.

The conductive connection member may include a base film and a conductive metal portion positioned on one entire surface of the base film. The conductive metal portion may be attached to the first electrode part and the second electrode part by the conductive adhesive.

The base film may be formed of a light transmissive material, and the conductive metal portion may be formed as a reflective metal layer The base film may be formed of polyethylene terephthalate (PET), polyimide (PI), or polyethylene naphthalate (PEN) having a thickness of 50 µm to 300 µm, and the reflective metal layer may be formed of silver (Ag) or aluminum (Al).

The base film and the conductive metal portion may include a body portion having a substantially rectangular planar shape having a predetermined length in a first direction and a predetermined width in a second direction perpendicular to the first direction.

The base film and the conductive metal portion may have a planar shape further including at least one branch portion extended from the body portion in the second direction. The at least one branch portion may be electrically connected to the first electrode part.

As another example, the conductive connection member may be formed as a metal foil. The metal foil may include a body portion having a substantially rectangular planar shape having a predetermined length in a first direction and a predetermined width in a second direction perpendicular to the first direction. The metal foil may have a planar shape further including at least one branch portion extended from the body portion in the second direction. The at least one branch portion may be electrically connected to the first electrode part.

The conductive connection member having the above-described configuration may include a slit for stress relief.

The first electrode part may include a tab portion that is extended in the first direction and is attached to the body portion, and a busbar portion that is extended from the tab portion in the second direction in a state of being electrically and physically connected to the tab portion and is attached to a branch portion.

As another example, the first electrode part may include a tab portion that is extended in the first direction and is attached to the body portion, and a finger portion that is spaced apart from the tab portion in the second direction, is extended in the first direction, and is attached to a branch portion.

As another example, the first electrode part may include a tab portion that is extended in the first direction and is attached to the body portion, a busbar portion that is extended from the tab portion in the second direction in a state of being electrically and physically connected to the tab portion and is attached to a branch portion, and a plurality of finger portions that is spaced apart from the tab portion in the second direction, is extended in the first direction, and is electrically and physically connected to the busbar portion.

The front substrate may be formed of a low iron tempered glass having a good transmittance, and the back substrate may be formed of the low iron tempered glass.

Alternatively, the front substrate may be formed of a high permeability fluorine film, and the back substrate may be formed of one of polyvinyl fluoride (PVF), polyvinylidene fluoride (PVDF), and polyethylene terephthalate (PET).

An encapsulant may be positioned between the front substrate and the back substrate to encapsulate the plurality of compound semiconductor solar cells.

The encapsulant may be formed of at least one of polyethylene terephthalate (PET), polyolefin (PO), ionomer, polyvinyl butyral (PVB), or silicone.

The encapsulant may include a front encapsulant between the front substrate and the plurality of compound semiconductor solar cells and a back encapsulant between the plurality of compound semiconductor solar cells and the back substrate. The front encapsulant and the back encapsulant may be formed of the same material or different materials.

Alternatively, the encapsulant is not positioned between the plurality of compound semiconductor solar cells and the back substrate and may be positioned only between the front substrate and the plurality of compound semiconductor solar cells. A light reflective coating layer may be positioned on an inner surface of the back substrate to reflect light incident through the front substrate.

In this instance, the plurality of compound semiconductor solar cells may be disposed so that they directly contact the light reflective coating layer. The plurality of compound semiconductor solar cells may be encapsulated by the encapsulant that covers the plurality of compound semiconductor solar cells and covers the light reflective coating layer between the adjacent compound semiconductor solar cells.

Even when the light reflective coating layer is positioned on the inner surface of the back substrate, the back encapsulant may be additionally positioned between the light reflective coating layer and the compound semiconductor solar cell.

Air or an inert gas may be filled between the front substrate and the back substrate, instead of the encapsulant.

In this instance, a distance between the front substrate and the back substrate may be maintained by a spacer. The spacer may be positioned in a space between compound semiconductor solar cells, that are arranged adjacent to each other on different strings.

The plurality of compound semiconductor solar cells may be attached to the back substrate by an adhesive positioned on the inner surface of the back substrate and may be spaced apart from the back substrate by a predetermined distance.

A sealant may be positioned at an edge of the solar cell module to prevent moisture from the outside from penetrating into the inside of the solar cell module. The sealant may include a thermoplastic spacer attached to an inner surface of the front substrate and an inner surface of the back substrate and a silicone that is attached to the inner surface of the front substrate and the inner surface of the back substrate and surrounds the thermoplastic spacer. The thermoplastic spacer may include a moisture absorbent therein.

Thus, the solar cell module may have a frameless structure that does not include a metal frame surrounding the peripheral edge of the solar cell module.

The solar cell module may physically attach the electrode part of the compound semiconductor solar cell to the conductive connection member using the low temperature curable paste cured at a predetermined temperature, for example, at a temperature of 180° C. or lower as the conductive adhesive, and may electrically connect the electrode part of the compound semiconductor solar cell to the conductive connection member. Therefore, the solar cell module can reduce a thermal stress applied to the compound semiconductor solar cell in a process for modularizing the solar cell module including the compound semiconductor solar cells and can prevent thermal deformation of the compound semiconductor solar cell.

As described above, the thickness of the second adhesive attaching the second electrode part to the conductive connection member may be greater than the thickness of the first adhesive attaching the first electrode part to the conductive connection member. In this instance, even when a height difference is generated between the first electrode part and the second electrode part due to a formation location of the first electrode part and the second electrode part, the conductive connection member may be substantially flush with the compound semiconductor substrate. Thus, an attachment operation of the conductive connection member can be efficiently performed.

Because the conductive connection member is attached to the electrode part of the compound semiconductor solar cell in a state of being substantially flush with the compound semiconductor substrate, a distance between the two adjacent compound semiconductor solar cells can decrease.

Because light incident on the conductive connection member is reflected using the conductive metal portion or the metal foil, an amount of light incident on the compound semiconductor solar cell can increase. Thus, high efficiency of the solar cell module including the compound semiconductor solar cells can be achieved.

When air or the inert gas is filled between the front substrate and the back substrate, instead of the encapsulant, an optical effect of the solar cell module can be further improved.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
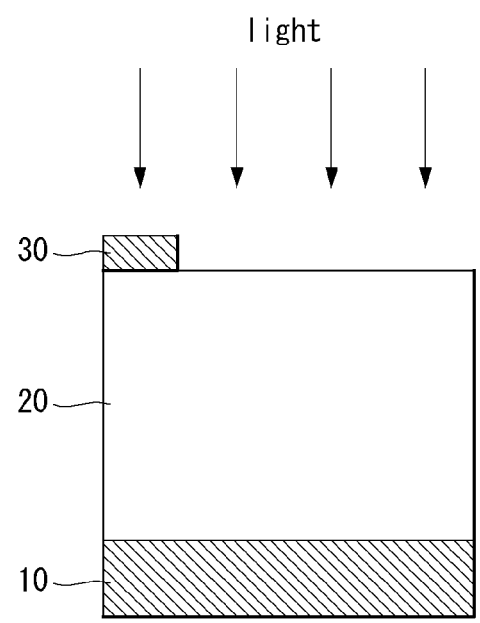
FIG. 1 schematically illustrates a configuration of a compound semiconductor solar cell according to a related art.
Figure 2:
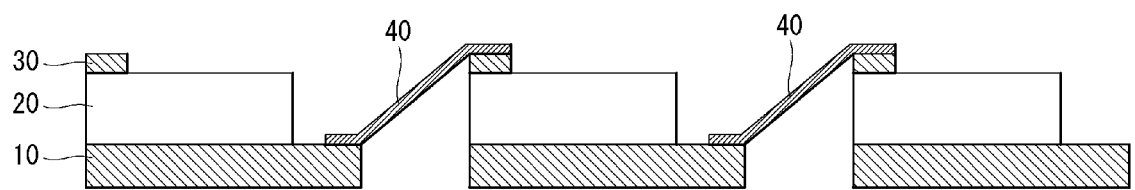
FIG. 2 illustrates an electrical coupling relationship between compound semiconductor solar cells of FIG. 1 included a solar cell module.

Reference will now be made in detail embodiments of the invention examples of which are illustrated in the accompanying drawings. Since the present disclosure may be modified in various ways and may have various forms, specific embodiments are illustrated in the drawings and are described in detail in the present specification. However, it should be understood that the present disclosure is not limited to specific disclosed embodiments, but include all modifications, equivalents and substitutes included within the spirit and technical scope of the present disclosure.

The terms "first", "second", etc. may be used to describe various components, but the components are not limited by such terms. The terms are used only for the purpose of distinguishing one component from other components.

For example, a first component may be designated as a second component, and a second component may be designated as a first component without departing from the scope of the present invention.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component.

On the other hand, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless otherwise specified, all of the terms which are used herein, including the technical or scientific terms, have the same meanings as those that are generally understood by a person having ordinary knowledge in the art to which the present invention pertains.

The terms defined in a generally used dictionary must be understood to have meanings identical to those used in the context of a related art, and are not to be construed to have ideal or excessively formal meanings unless they are obviously specified in the present application.

The following example embodiments of the present invention are provided to those skilled in the art in order to describe the present invention more completely. Accordingly, shapes and sizes of elements shown in the drawings may be exaggerated for clarity.

Hereinafter, a first embodiment of the invention is described with reference to FIGS. 3 to 6, FIG. 9, and FIGS. 12 and 13.

Figure 3:
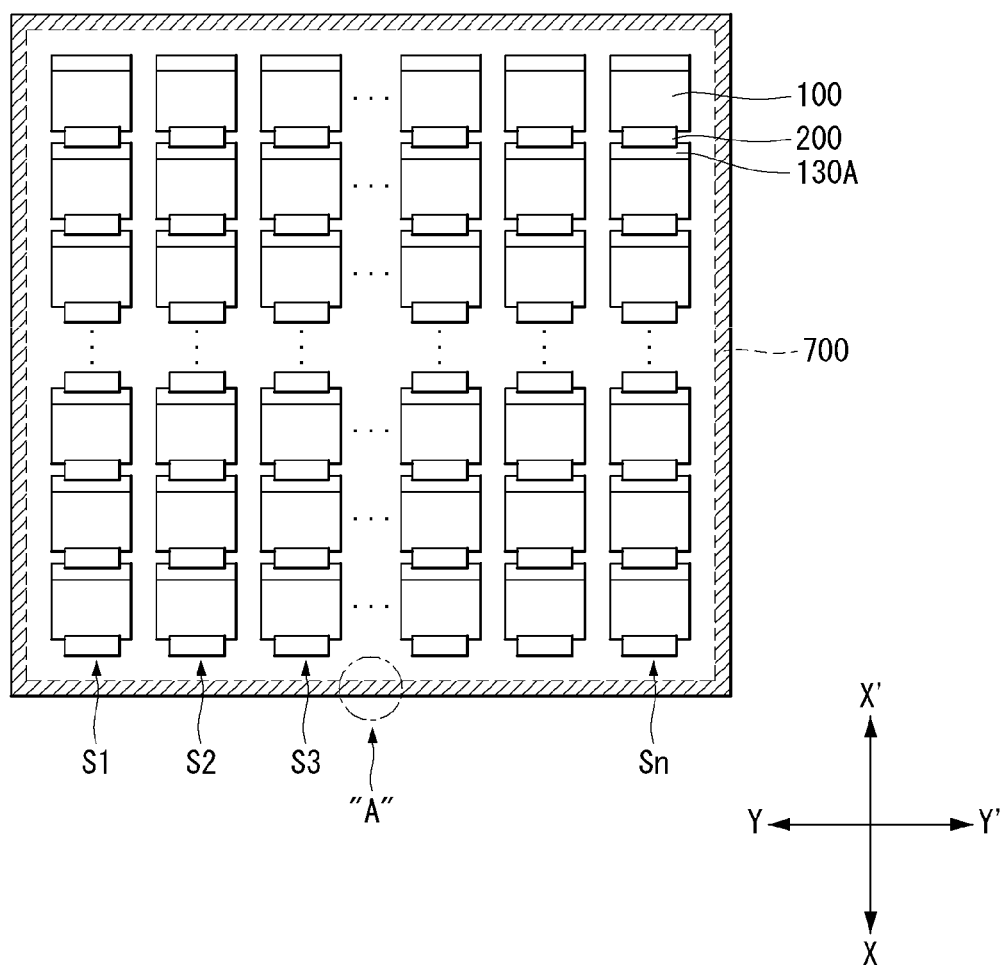
FIG. 3 is a plan view of a solar cell module according to a first embodiment of the invention.
Figure 4:
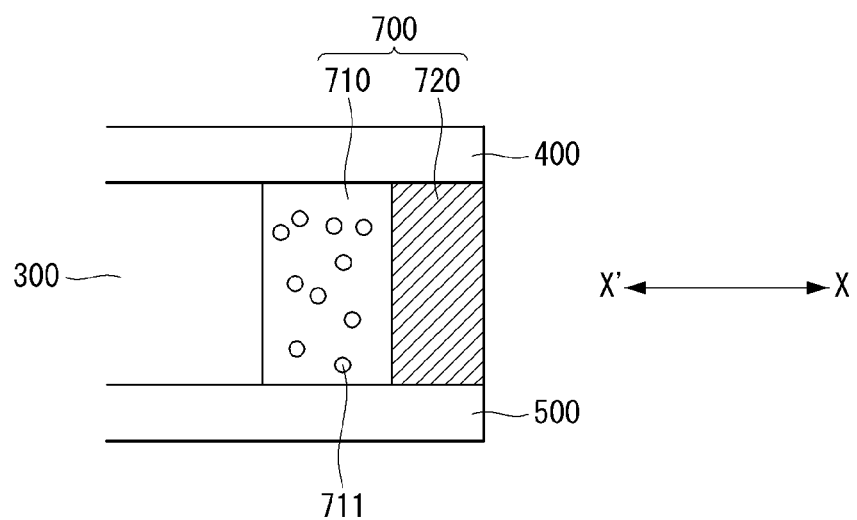
FIG. 4 is a cross-sectional view of a second direction illustrating a portion "A" of a solar cell module shown in FIG. 3.

FIG. 3 is a plan view of a solar cell module according to a first embodiment of the invention, and FIG. 4 is a cross-sectional view of a second direction illustrating a portion "A" of a solar cell module shown in FIG. 3.

Figure 5:
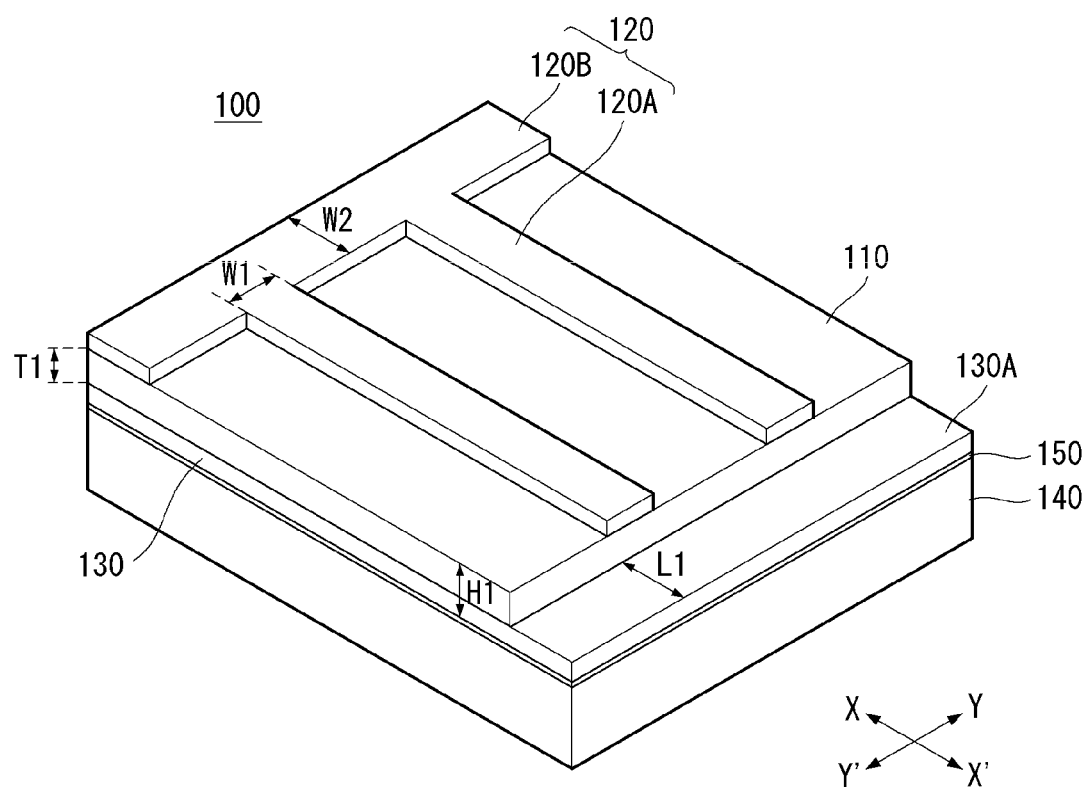
FIG. 5 is a perspective view illustrating a first example of a compound semiconductor solar cell shown in FIG. 3.
Figure 6:
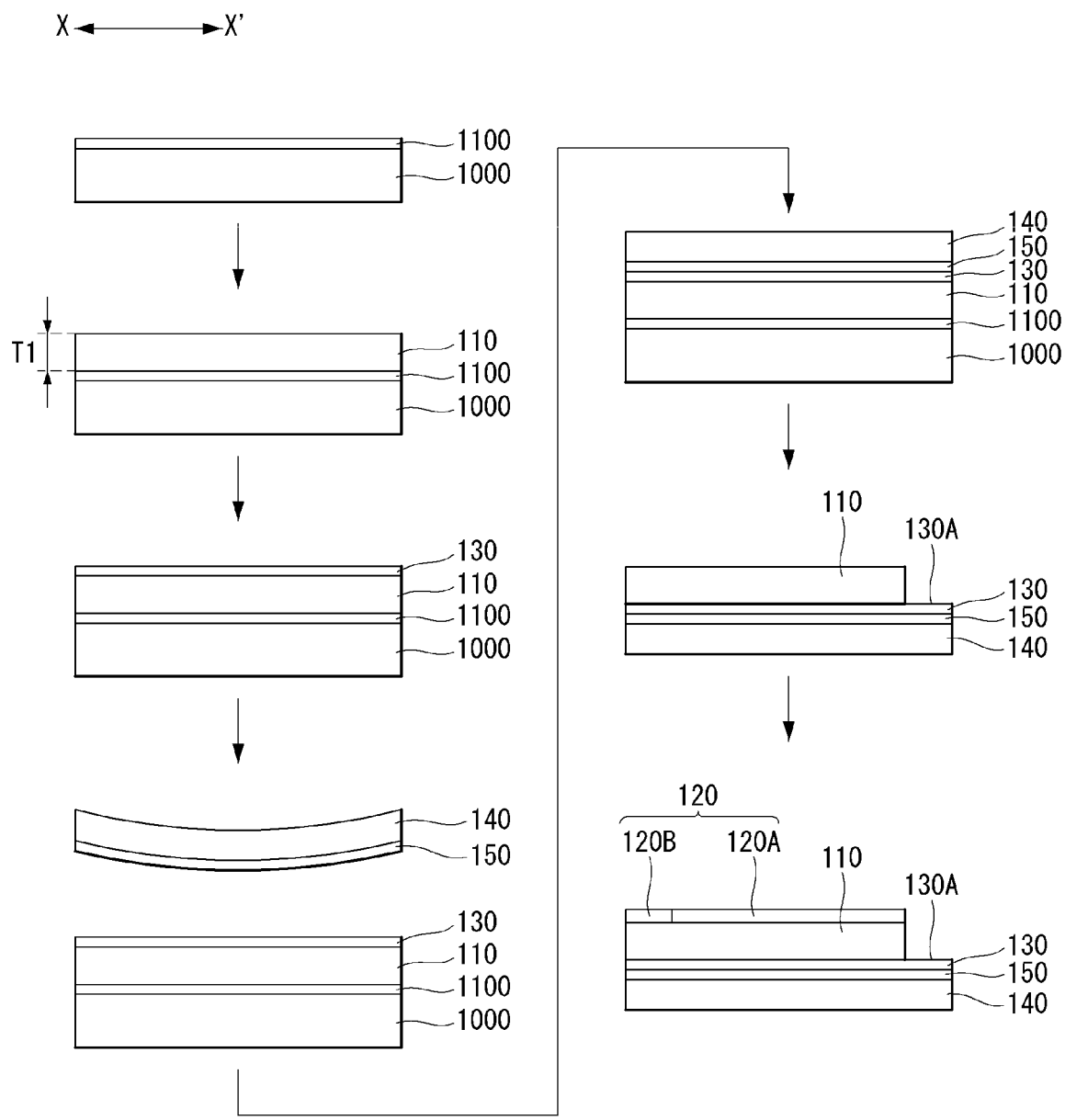
FIG. 6 illustrates a method of manufacturing a compound semiconductor solar cell shown in FIG. 5.

FIG. 5 is a perspective view illustrating a first example of a compound semiconductor solar cell shown in FIG. 3, and FIG. 6 illustrates a method of manufacturing a compound semiconductor solar cell shown in FIG. 5.

Figure 9:
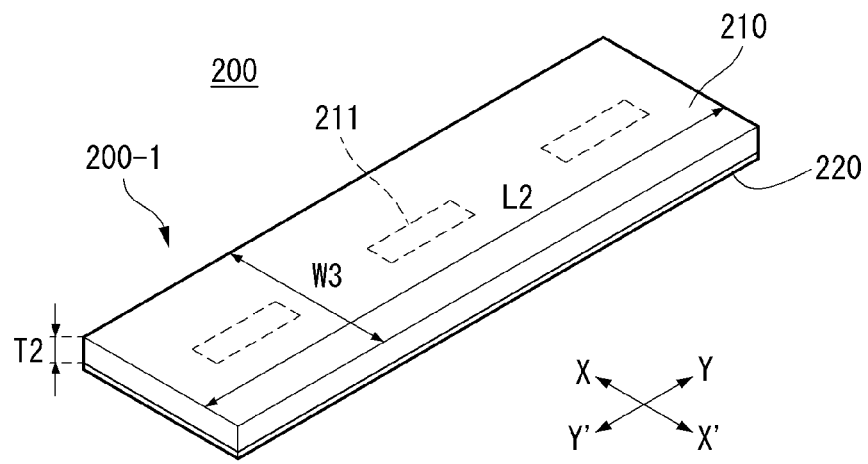
FIG. 9 is a perspective view illustrating a first example of a conductive connection member shown in FIG. 3.
Figure 12:
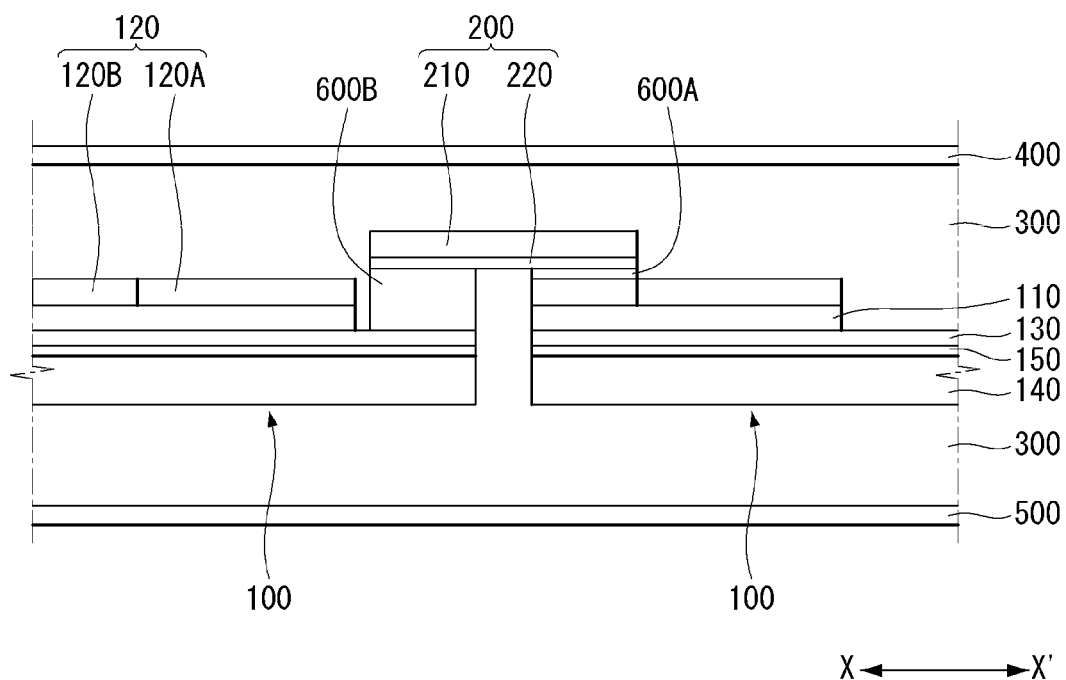
FIG. 12 is a cross-sectional view of a second direction illustrating an electrical coupling relationship between adjacent compound semiconductor solar cells in a solar cell module including a compound semiconductor solar cell shown in FIG. 5 and a conductive connection member shown in FIG. 9.
Figure 13:
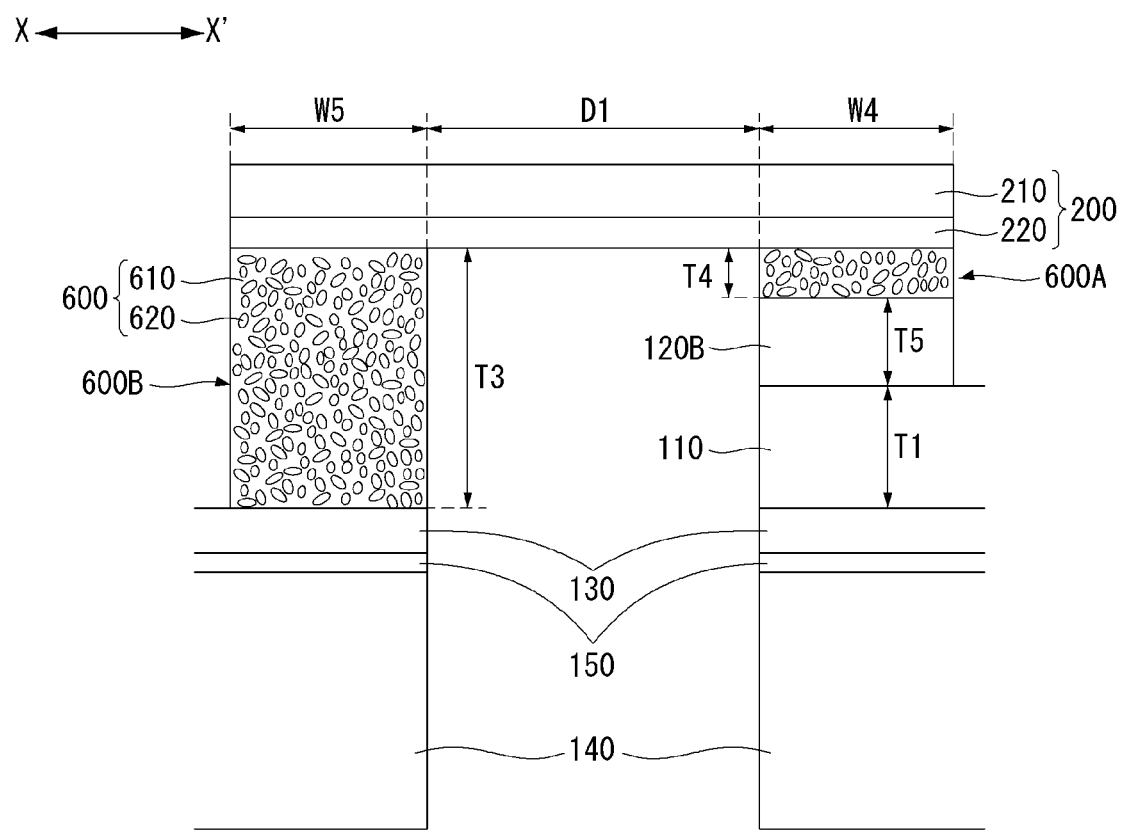
FIG. 13 is an enlarged view of a main part of a solar cell module shown in FIG. 12.

FIG. 9 is a perspective view illustrating a first example of a conductive connection member shown in FIG. 3. FIG. 12 is a cross-sectional view of a second direction illustrating an electrical coupling relationship between adjacent compound semiconductor solar cells in a solar cell module including a compound semiconductor solar cell shown in FIG. 5 and a conductive connection member shown in FIG. 9. FIG. 13 is an enlarged view of a main part of a solar cell module shown in FIG. 12.

A solar cell module according to a first embodiment of the invention includes a plurality of compound semiconductor solar cells 100.

The plurality of compound semiconductor solar cells 100 has a plurality of strings S1, S2, . . . , and Sn. The compound semiconductor solar cells 100 arranged on the same string are electrically connected in series to one another by a conductive connection member 200. Although not shown in FIG. 3, adjacent compound semiconductor solar cells of adjacent strings are connected in series to one another by strip-shaped conductive ribbons or lead wires.

For example, a lead wire for lead-out is attached to a first electrode part or a second electrode part of a compound semiconductor solar cell on a first line of a first string S1 and a second electrode part or a first electrode part of a compound semiconductor solar cell on a first line of a last string Sn.

Further, a first electrode part or a second electrode part of a compound semiconductor solar cell on a last line of the first string S1 is connected in series to a second electrode part or a first electrode part of a compound semiconductor solar cell on a last line of a second string S2 by the conductive ribbon or the lead wire. A first electrode part or a second electrode part of a compound semiconductor solar cell on a first line of the second string S2 is connected in series to a second electrode part or a first electrode part of a compound semiconductor solar cell on a first line of a third string S3 by the conductive ribbon or the lead wire.

All the compound semiconductor solar cells included in the solar cell module according to the first embodiment of the invention are electrically connected in series to one another in accordance with such an electrical coupling manner.

As shown in FIG. 5, the compound semiconductor solar cell 100 according to the first embodiment of the invention includes a compound semiconductor substrate 110 including a light absorbing layer, a first electrode part 120 positioned on a front surface of the compound semiconductor substrate 110, an insulating substrate 140 that is positioned at a back surface of the compound semiconductor substrate 110 and supports the compound semiconductor substrate 110, a second electrode part 130 that is positioned between the back surface of the compound semiconductor substrate 110 and a front surface of the insulating substrate 140 and is extended to the outside of one end of the compound semiconductor substrate 110, and an insulating adhesive 150 attaching the second electrode part 130 to the insulating substrate 140.

In the embodiment disclosed herein, "front surface" indicates a surface facing the front of the first electrode part 120, and "back surface" indicates a surface facing the rear of the insulating substrate 140.

The compound semiconductor substrate 110 is manufactured from a mother substrate through a metal organic chemical vapor deposition (MOCVD) method, a molecular beam epitaxy (MBE) method, or another proper method for forming an epitaxial layer.

Referring to FIG. 6, a mother substrate 1000 may serve as a base providing a proper lattice structure for the compound semiconductor substrate 110. The mother substrate 1000 may be made of GaAs, InP, GaP, GaSb, or another III-V compound.

In the following description, a case in which the compound semiconductor substrate 110 is formed of GaAs compound is described as an example.

The mother substrate 1000 may be a substrate that was previously used to manufacture one or more compound semiconductor substrates 110.

Namely, the mother substrate 1000 may be separated from the compound semiconductor substrate 110 at some stages of a manufacturing process and may be reused for manufacturing other compound semiconductor substrates.

A sacrificial layer 1100 is formed on the mother substrate 1000. The sacrificial layer 1100 is formed on the mother substrate 1000 using a metal organic chemical vapor deposition (MOCVD) method, a molecular beam epitaxy (MBE) method, or another proper method for forming an epitaxial layer.

The sacrificial layer 1100 is formed of a material that can be removed using an epitaxial lift-off (ELO) process.

The compound semiconductor substrate 110 is formed on the sacrificial layer 1100. The compound semiconductor substrate 110 may include one or more light absorbing layers.

The light absorbing layer indicates a layer or an area of a compound semiconductor solar cell having a specific band gap energy characteristic and uses a specific portion of a solar spectrum in electricity generation.

When the compound semiconductor substrate 110 includes two or more light absorbing layers, the light absorbing layers may have different band gap energy characteristics.

The compound semiconductor substrate 110 having the above-described configuration may be made of a GaAs substrate having a thickness T1 of 1 μm to 10 μm.

Although not shown in detail, the compound semiconductor substrate 110 may have various structures.

When the compound semiconductor substrate 110 is manufactured, a metal layer used as the second electrode part 130 is formed on an exposed surface of the compound semiconductor substrate 110. The metal layer may be formed using a vapor deposition method.

When the second electrode part 130 is formed, the compound semiconductor substrate 110 is peeled from the mother substrate 1000 using the insulating substrate 140, of which one surface is applied with the insulating adhesive 150.

In this instance, the insulating adhesive 150 is not applied to the insulating substrate 140 and may be applied to the second electrode part 130 of the compound semiconductor substrate 110.

In order to easily perform the peeling of the compound semiconductor substrate 110, the insulating substrate 140 may be configured such that its both ends bend more than its center portion as shown in FIG. 6.

When the insulating substrate 140 having a bending shape is used as described above, both ends of the insulating substrate 140 in a state where the insulating substrate 140 is attached to the second electrode part 130 applies a force to the compound semiconductor substrate 110 in a direction for peeling the compound semiconductor substrate 110 from the mother substrate 1000. Therefore, the compound semiconductor substrate 110 can be efficiently peeled from the mother substrate 1000.

After the compound semiconductor substrate 110 is peeled from the mother substrate 1000, one end of the compound semiconductor substrate 110 is etched to expose a portion of the second electrode part 130. An exposed portion of the second electrode part 130 is formed as an extension 130A to which one end of the conductive connection member 200 is attached by a conductive adhesive 600 (see FIG. 13).

Afterwards, the first electrode part 120 is formed on the exposed surface of the compound semiconductor substrate 110.

The first electrode part 120 and the second electrode part 130 collect carriers generated in the light absorbing layer of the compound semiconductor substrate 110.

As shown in FIG. 5, the first electrode part 120 may include a plurality of busbar portions 120A formed in a second direction X-X' and a tab portion 120B that has a predetermined length in a first direction Y-Y' and physically and electrically connects one end of each of the plurality of busbar portions 120A.

The plurality of busbar portions 120A may be spaced apart from one another in the first direction Y-Y' and may have a stripe shape extended in the second direction X-X'. The tab portion 120B may be physically and electrically connected to the ends of the plurality of busbar portions 120A and may have a stripe shape extended in the first direction Y-Y'. The tab portion 120B may be positioned at one end, for example, a left end of the compound semiconductor substrate 110.

Each of the plurality of busbar portions 120A functions to collect carriers. The tab portion 120B functions to gather carriers collected by the plurality of busbar portions 120A and supply the carriers to an external electrical circuit.

A width W1 of each busbar portion 120A may be less than a width W2 of the tab portion 120B. For example, the width W2 of the tab portion 120B in the second direction X-X' may be more than several to several tens of times the width W1 of the busbar portion 120A in the first direction Y-Y'.

The first electrode part 120 having the above-described configuration may be formed of an electrically conductive material. For example, the first electrode part 120 may be formed of at least one of gold (Au), germanium (Ge), and nickel (Ni).

Although not shown, a cap layer forming an ohmic contact may be formed between the first electrode part 120 and the compound semiconductor substrate 110, and an anti-reflective layer may be formed in a portion of the front surface of the compound semiconductor substrate 110, on which the first electrode part 120 is not formed.

The second electrode part 130 may be entirely positioned on the back surface of the compound semiconductor substrate 110.

In embodiments disclosed herein, "entirely positioned" means that the second electrode part 130 substantially covers the entire back surface of the compound semiconductor substrate 110.

Further, the second electrode part 130 covers the entire front surface of the insulating substrate 140.

Accordingly, the second electrode part 130 includes the extension 130A extended to the outside of the end of the compound semiconductor substrate 110. The extension 130A is physically attached to the conductive connection member 200 for electrically connecting the second electrode part 130 to a tab portion 120B of a first electrode part 120 of a compound semiconductor solar cell 100 adjacent to the second electrode part 130.

The extension 130A of the second electrode part 130 may be extended to the outside of the end of the compound semiconductor substrate 110 by a predetermined length L1, for example, 0.1 mm to 5 mm along the second direction X-X'.

A reason why the length L1 of the extension 130A in the second direction X-X' is equal to or greater than 0.1 mm is that it is difficult to physically attach the conductive connection member 200 when the length L1 of the extension 130A is less than 0.1 mm. Further, a reason why the length L1 of the extension 130A in the second direction X-X' is equal to or less than 5 mm is that a light absorption area decreases due to an increase in a dead space of the solar cell module, which is unusable in the light absorption, when the length L1 of the extension 130A is greater than 5 mm.

According to an experiment of the present inventors, it was preferable, but not required, that the extension 130A was extended to the outside of one end of the compound semiconductor substrate 110 by the length L1 of about 0.1 mm to 2 mm.

An operation of the compound semiconductor solar cell 100 having the above-described configuration is described below.

When light is incident on a front surface of the compound semiconductor solar cell 100, the incident light generates electron-hole pairs inside the compound semiconductor substrate 110. The electron-hole pairs are separated into electrons and holes by a p-n junction, and then the electrons and the holes move to the first electrode part 120 and the second electrode part 130.

The solar cell module according to the embodiment of the invention includes a plurality of compound semiconductor solar cells 100, a conductive connection member 200 for electrically connecting two adjacent compound semiconductor solar cells 100, an encapsulant 300 for encapsulating the plurality of compound semiconductor solar cells 100, a light transmission front substrate 400 disposed on the encapsulant 300 at front surfaces of the plurality of compound semiconductor solar cells 100, a back substrate 500 disposed under the encapsulant 300 at back surfaces of the plurality of compound semiconductor solar cells 100, and a conductive adhesive 600 for physically attaching the conductive connection member 200 to a corresponding electrode part of the compound semiconductor solar cell 100.

The back substrate 500 can prevent moisture and oxygen from penetrating into a back surface of the solar cell module and protect the plurality of compound semiconductor solar cells 100 from an external environment.

The back substrate 500 may have a multi-layered structure including a moisture/oxygen penetrating prevention layer, a chemical corrosion prevention layer, an insulating characteristic layer, etc. For example, the back substrate 500 may be formed of one of polyvinyl fluoride (PVF), polyvinylidene fluoride (PVDF), polyethylene terephthalate (PET), and low iron tempered glass.

The encapsulant 300 forms one body with the plurality of compound semiconductor solar cells 100 when a lamination process is performed in a state where the encapsulant 300 is disposed on and under the plurality of compound semiconductor solar cells 100, thereby preventing corrosion due to the moisture penetration and protecting the plurality of compound semiconductor solar cells 100 from an impact.

The encapsulant 300 may be formed of ethylene vinyl acetate (EVA), polyolefin (PO), ionomer, polyvinyl butyral (PVB), and silicone resin.

The encapsulant 300 may include a front encapsulant between the front substrate 400 and the plurality of compound semiconductor solar cells 100 and a back encapsulant between the plurality of compound semiconductor solar cells 100 and the back substrate 500. The front encapsulant and the back encapsulant may be formed of the same material or different materials.

The front substrate 400 on the encapsulant 300 may be formed of a tempered glass, etc. having a high transmittance and an excellent damage prevention function, or a high permeability fluorine film.

In this instance, the tempered glass may be low iron tempered glass containing a small amount of iron.

As shown in FIG. 9, the conductive connection member 200 includes a base film 210 and a conductive metal portion 220 (for example, a reflective metal layer 220) positioned on at least one surface, for example, an entire lower surface of the base film 210.

The base film 210 may be formed of a light transmissive material, for example, polyethylene terephthalate (PET), polyimide (PI), or polyethylene naphthalate (PEN) and may have a thickness T2 of 50 µm to 300 µm.

The reflective metal layer 220 may be formed of silver (Ag) or aluminum (Al).

According to the conductive connection member 200 having the above-described configuration, light incident on a space (i.e., the conductive connection member 200) between the two adjacent compound semiconductor solar cells 100 passes through the base film 210 and then is reflected from the reflective metal layer 220. The reflected light is again reflected by the front substrate 400 and is incident on incident surfaces of the compound semiconductor solar cells 100.

Accordingly, an amount of light incident on the compound semiconductor solar cell 100 increases, and an output of the solar cell module increases.

However, the base film 210 may be formed of an opaque material or a semitransparent material. In this instance, a separate reflective surface may be formed on another surface of the base film 210, i.e., a surface opposite a surface of the base film 210, on which the reflective metal layer 220 is positioned.

The base film 210 may include scattering particles for scattering light therein.

When the reflective metal layer 220 is entirely positioned on the lower surface of the base film 210, the base film 210 and the reflective metal layer 220 may be formed as a body portion 200-1 having a substantially rectangular planar shape having a predetermined length L2 in the first direction Y-Y' and a predetermined width W3 in the second direction X-X'.

In this instance, the length L2 of the conductive connection member 200 in the first direction Y-Y' may be equal to or less than a length of the compound semiconductor substrate 110 in the first direction Y-Y'.

When the conductive connection member 200 is formed in the substantially rectangular planar shape as described above, light incident on the space between the two adjacent compound semiconductor solar cells 100 can be effectively reflected, and an attaching area between the conductive connection member 200 and the corresponding electrode part can be effectively increased.

As shown by the dotted line of FIG. 9, the conductive connection member 200 may include a slit 211 for stress relief on the body portion 200-1.

The conductive adhesive 600 for physically attaching the conductive connection member 200 to a corresponding electrode part of the compound semiconductor solar cell 100 is formed of a low temperature curable paste.

As shown in FIG. 13, the low temperature curable paste may include a thermosetting resin 610 cured at a temperature of 180° C. or lower, preferably 150° C. or lower and a plurality of conductive particles 620 dispersed in the thermosetting resin 610. The thermosetting resin 610 may include an epoxy-based resin or a silicone-based resin, and the conductive particles 620 may include at least one of Ag, SnBi, Ni and Cu.

The conductive particles 620 may be formed in various shapes including a flake shape, a sphere shape, a chestnut bur shape, etc.

When the conductive connection member 200 is physically attached to the corresponding electrode part 120 or 130 using the conductive adhesive 600 that is formed of the low temperature curable paste as described above, a thermal stress applied to the compound semiconductor solar cell 100 can decrease, and thermal deformation of the compound semiconductor solar cell 100 can be prevented.

In the compound semiconductor solar cell 100 shown in FIG. 5, both the first electrode part 120 and the second electrode part 130 are positioned at the front surface of the insulating substrate 140. However, more specifically, the first electrode part 120 is positioned at the front surface of the compound semiconductor substrate 110, and the second electrode part 130 is positioned at the back surface of the compound semiconductor substrate 110.

Therefore, a height difference H1 is generated between the first electrode part 120 and the second electrode part 130.

In embodiments disclosed herein, the height difference H1 is a distance between a back surface of the second electrode part 130 and a back surface of the first electrode part 120, or a distance between a front surface of the second electrode part 130 and a front surface of the first electrode part 120.

Accordingly, when the two adjacent compound semiconductor solar cells 100 are electrically connected using the conductive connection member 200, it was not easy to perform a process for attaching the two adjacent compound semiconductor solar cells 100 using the conductive connection member 200 due to the height difference H1 in the related art. Hence, in the related art, the attachment process of the conductive connection member 200 was manually performed by an operator.

On the other hand, as shown in FIG. 13, in order to easily perform the attachment process of the conductive connection member 200 in the solar cell module according to the embodiment of the invention, a thickness T3 of a second adhesive 600B for physically attaching the second electrode part 130 to the conductive connection member 200 is set to be greater than a thickness T4 of a first adhesive 600A for physically attaching the first electrode part 120 to the conductive connection member 200.

It may be preferable, but not required, that the thickness T3 of the second adhesive 600B may be substantially the same as a sum (T1+T4+T5) of the thickness T1 of the compound semiconductor substrate 110, the thickness T4 of the first adhesive 600A, and a thickness T5 of the first electrode part 120.

As described above, when the thickness T3 of the second adhesive 600B is set to be greater than the thickness T4 of the first adhesive 600A, the conductive connection member 200 may be substantially flush with the compound semiconductor substrate 110 in spite of the height difference H1 between the first electrode part 120 and the second electrode part 130. Thus, the attachment process of the conductive connection member 200 can be efficiently performed through an automatic process.

Because the conductive connection member 200 is attached to the electrode part of the compound semiconductor solar cell 100 in a state of being substantially flush with the compound semiconductor substrate 110, a width W3 of the conductive connection member 200 in the second direction X-X' can decrease compared to the related art. Further, a distance D1 between the two adjacent compound semiconductor solar cells 100 can decrease.

However, the thickness T3 of the second adhesive 600B may be less than a sum (T1+T4+T5) of the thickness T1 of the compound semiconductor substrate 110, the thickness T4 of the first adhesive 600A, and the thickness T5 of the first electrode part 120. On the contrary, the thickness T3 of the second adhesive 600B may be greater than a sum (T1+T4+T5) of the thickness T1 of the compound semiconductor substrate 110, the thickness T4 of the first adhesive 600A, and the thickness T5 of the first electrode part 120.

The first adhesive 600A and the second adhesive 600B may be applied to the electrode parts 120 and 130 by a printing method. In order for the thickness T3 of the second adhesive 600B to be greater than the thickness T4 of the first adhesive 600A, the first adhesive 600A may be formed by one printing process, and the second adhesive 600B may be formed by a plurality of printing processes.

Alternatively, each of the first adhesive 600A and the second adhesive 600B may be formed by a plurality of printing processes, and the number of printing processes of the second adhesive 600B may be more than the number of printing processes of the first adhesive 600A.

Unlike the above description, a width W4 of the first adhesive 600A in the second direction X-X' may be different from a width W5 of the second adhesive 600B in the second direction X-X', and the first adhesive 600A and the second adhesive 600B may have different widths and different thicknesses.

The conductive adhesive 600 including the first adhesive 600A and the second adhesive 600B may be cured using a tool heated to a predetermined temperature or may be cured using hot wind.

Figure 14:
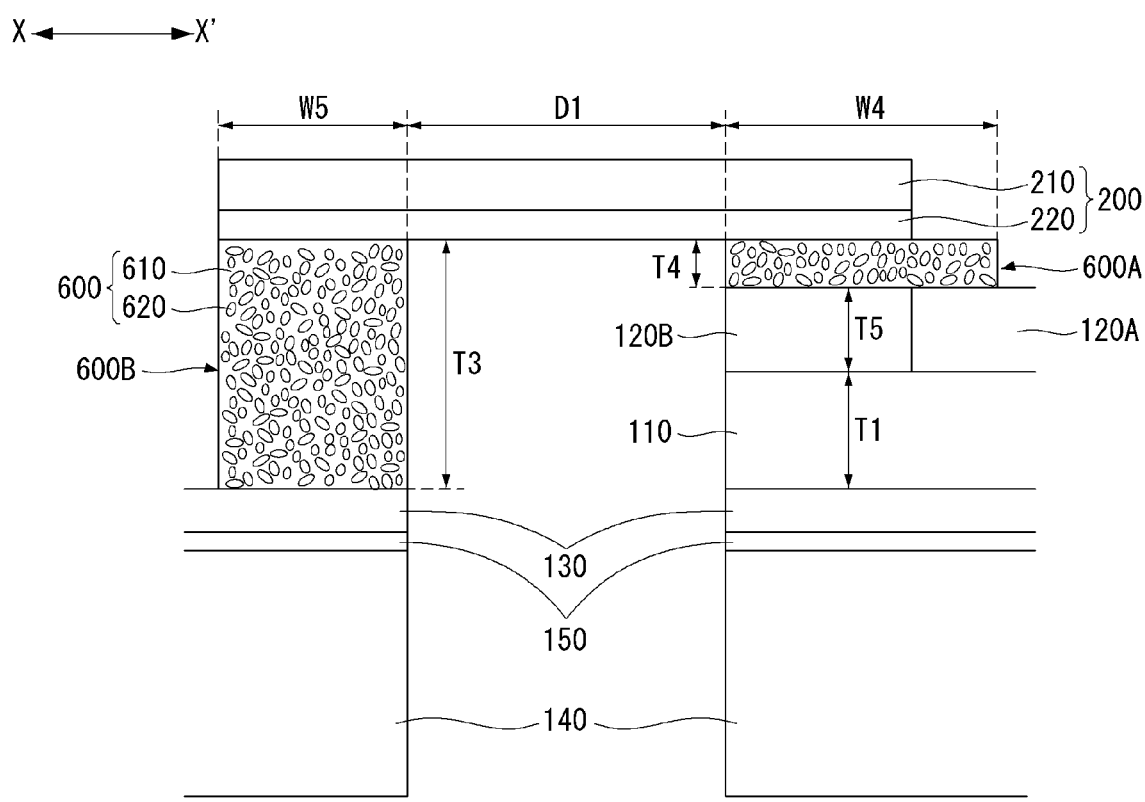
FIG. 14 illustrates a modified example of FIG. 13.

FIG. 14 illustrates a modified example of FIG. 13. More specifically, FIG. 14 illustrates a modified example where a width W4 of the first adhesive 600A in the second direction X-X' is different from a width W5 of the second adhesive 600B in the second direction X-X'.

In the embodiment of the invention, the width W4 of the first adhesive 600A in the second direction X-X' may be greater than the width W5 of the second adhesive 600B in the second direction X-X'.

When the first adhesive 600A and the second adhesive 600B are applied in the same amount or in similar amounts to each other, the width W4 of the first adhesive 600A is greater than the width W5 of the second adhesive 600B in a process for attaching the first adhesive 600A to the conductive connection member 200 and a process for attaching the second adhesive 600B to the conductive connection member 200.

The conductive adhesive 600 having the above-described configuration may be applied in a stripe shape extended along a longitudinal direction (i.e., the first direction Y-Y') of the body portion 200-1 of the conductive connection member 200, or may be locally applied only to a portion of the body portion 200-1.

When the conductive adhesive 600 is locally applied, the encapsulant 300 may be filled between the conductive adhesives 600 that are adjacent to each other in the first direction Y-Y'.

The width W4 of the first adhesive 600A in the second direction X-X' may be greater than the width W2 of the tab portion 120B of the first electrode part 120 in the second direction X-X'.

In this instance, a portion of the first adhesive 600A may be attached to a portion of the busbar portion 120A of the first electrode part 120.

The conductive connection member may be formed in various planar shapes.

Figure 10:
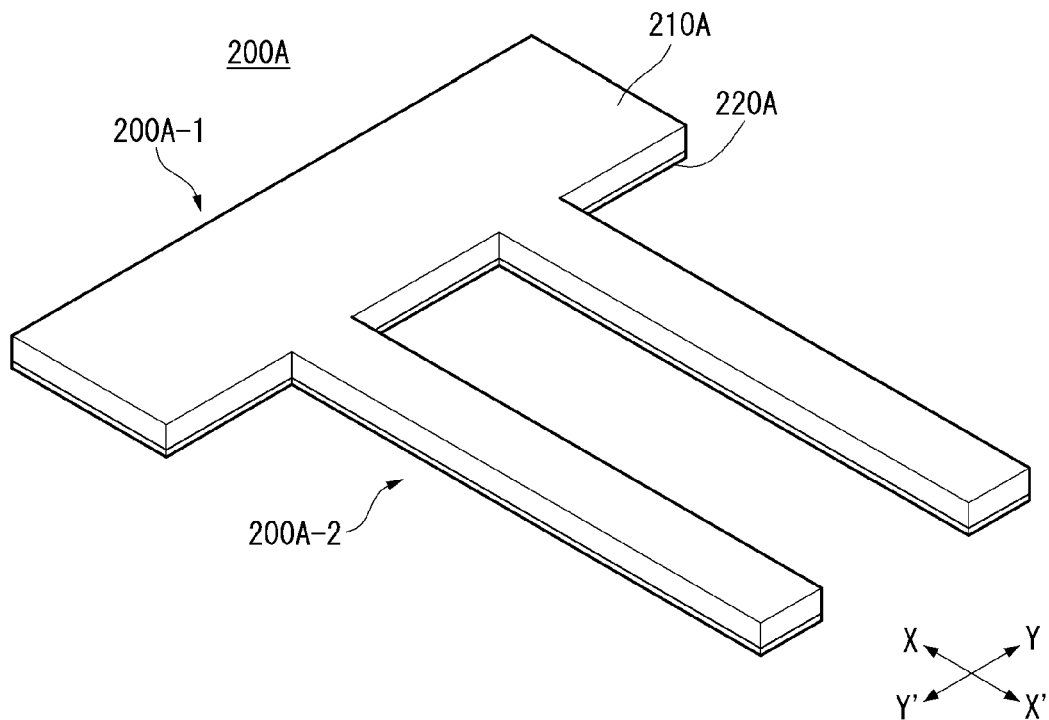
FIG. 10 is a perspective view illustrating a modified example of a conductive connection member shown in FIG. 9.

For example, as shown in FIG. 10, a conductive connection member 200A according to the embodiment of the invention may have a planar shape including a body portion 200A-1 including a base film 210A and a conductive metal portion 220A, that form a substantially rectangular planar shape having a predetermined length in the first direction Y-Y' and a predetermined width in the second direction X-X', and at least one branch portion 200A-2 extended from the body portion 200A-1 in a width direction (i.e., the second direction X-X') of the conductive connection member 200A.

The branch portion 200A-2 may be formed at a location corresponding to the busbar portion 120A of the first electrode part 120 and may be attached to the busbar portion 120A using the first adhesive 600A.

In the conductive connection member 200A having the above-described configuration, the conductive metal portion 220A may be formed on an entire lower surface of the base film 210A through the coating.

Figure 11:
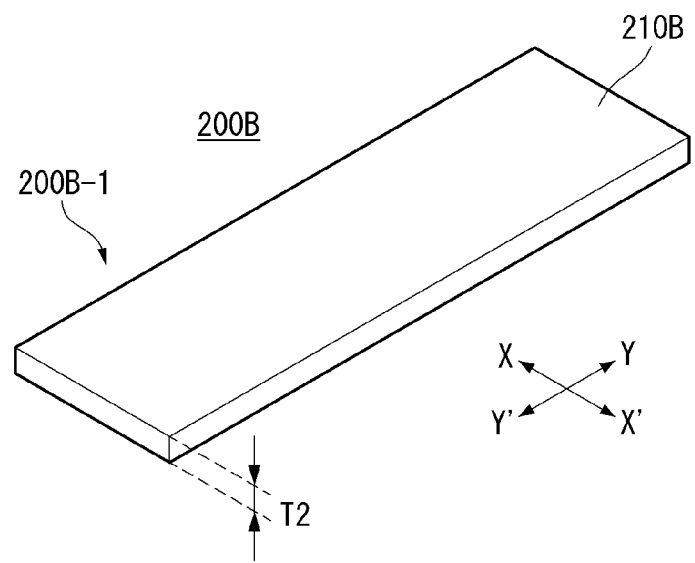
FIG. 11 is a perspective view illustrating a second example of a conductive connection member shown in FIG. 3.

Alternatively, as shown in FIG. 11, a conductive connection member 200B according to the embodiment of the invention may include a body portion 200B-1 having the same planar shape as the body portion 200-1 of the conductive connection member 200 shown in FIG. 9. Further, the conductive connection member 200B according to the embodiment of the invention may be formed as a metal foil 210B having a predetermined thickness T2, for example, the thickness T2 of 50 μm to 300 μm. The metal foil 210B may be formed in the same shape as the conductive connection member 200A shown in FIG. 10. Namely, the metal foil 210B may further include a branch portion.

Another example of the compound semiconductor solar cell applicable to the solar cell module according to the first embodiment of the invention is described below with reference to FIGS. 7 and 8.

Figure 7:
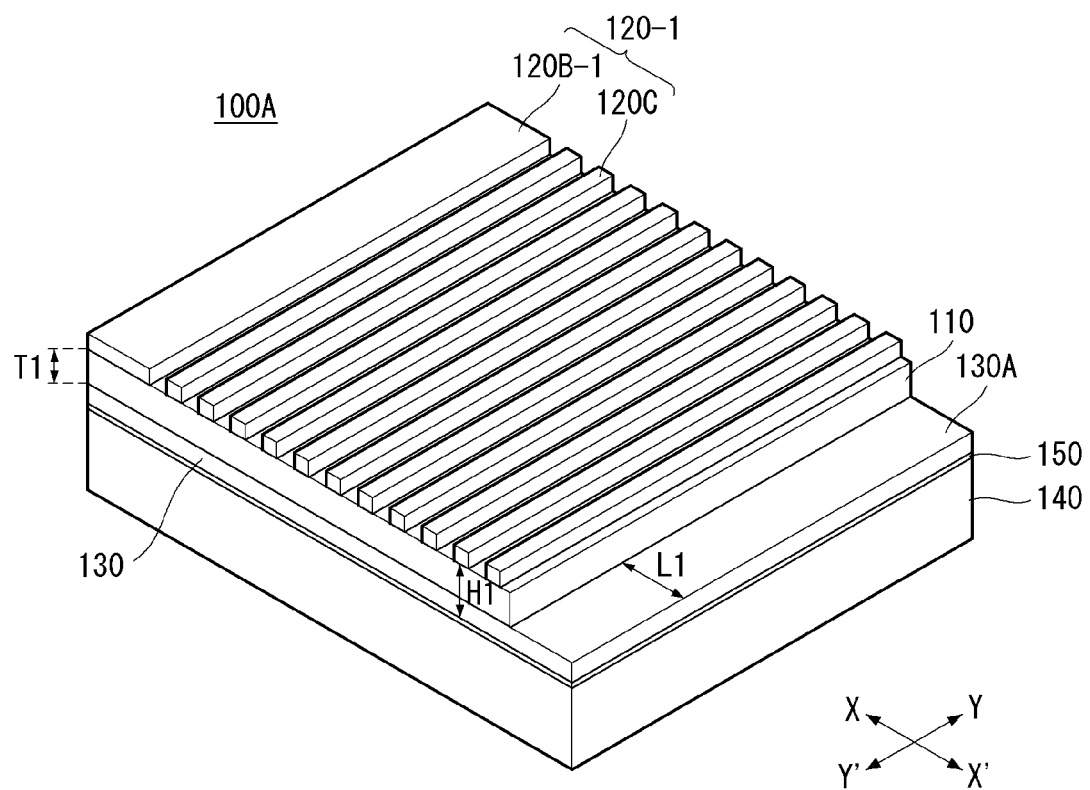
FIG. 7 is a perspective view illustrating a second example of a compound semiconductor solar cell shown in FIG. 3.
Figure 8:
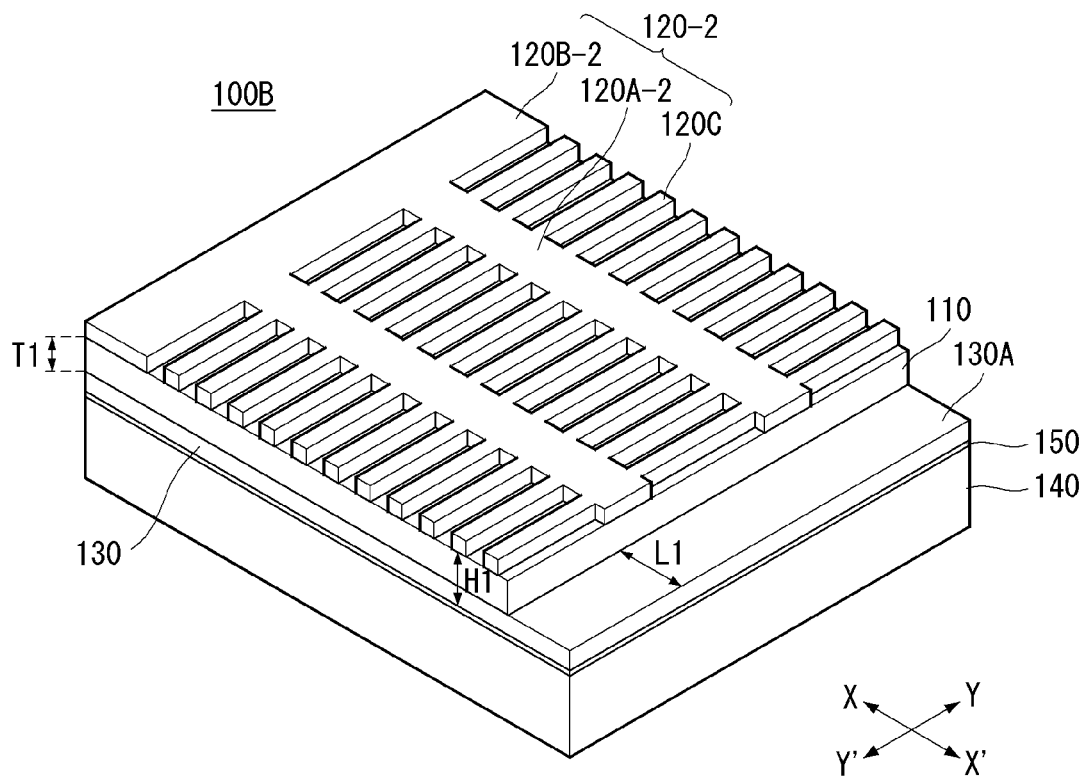
FIG. 8 is a perspective view illustrating a third example of a compound semiconductor solar cell shown in FIG. 3.

In the explanation of a compound semiconductor solar cell shown in FIGS. 7 and 8, a further description of structures and components identical or equivalent to the compound semiconductor solar cell shown in FIG. 5 may be briefly made or may be entirely omitted.

FIG. 7 is a perspective view illustrating a second example of the compound semiconductor solar cell shown in FIG. 3, and FIG. 8 is a perspective view illustrating a third example of the compound semiconductor solar cell shown in FIG. 3.

Since compound semiconductor solar cells shown in FIGS. 7 and 8 are substantially the same as the compound semiconductor solar cell shown in FIG. 5 except a structure of a first electrode part, only the structure of the first electrode part is described below.

A first electrode part 120-1 of a compound semiconductor solar cell 100A shown in FIG. 7 may be extended in the first direction Y-Y'. The first electrode part 120-1 may include a tab portion 120B-1 attached to body portions 200-1, 200A-1, and 200B-1 of conductive connection members 200, 200A, and 200B and a plurality of finger portions 120C that is spaced apart from the tab portion 120B-1 in the second direction X-X' and is extended in the first direction Y-Y'.

Accordingly, when the conductive connection member 200A shown in FIG. 10 is used, at least one branch portion 200A-2 is extended in a direction crossing the plurality of finger portions 120C. Therefore, the at least one branch portion 200A-2 may be physically attached to the plurality of finger portions 120C by a conductive adhesive and may be electrically connected to the plurality of finger portions 120C.

Unlike FIG. 7, a first electrode part 120-2 of a compound semiconductor solar cell 100B shown in FIG. 8 may further includes a plurality of busbar portions 120A-2. That is, the first electrode part 120-2 may include a tab portion 120B-2 attached to body portions 200-1, 200A-1, and 200B-1 of conductive connection members 200, 200A, and 200B; the plurality of busbar portions 120A-2 that is extended from the tab portion 120B-2 in the second direction X-X' in a state of being electrically and physically connected to the tab portion 120B-2 and is attached to a branch portion 200A-2; and a plurality of finger portions 120C that that is spaced apart from the tab portion 120B-2 in the second direction X-X', is extended in the first direction Y-Y', and is electrically and physically connected to the busbar portion 120A-2.

Accordingly, when the conductive connection member 200A shown in FIG. 10 is used, at least one branch portion 200A-2 may be physically attached to the plurality of busbar portions 120A-2 by a conductive adhesive and may be electrically connected to the plurality of busbar portions 120A-2.

In the solar cell module including one of the compound semiconductor solar cells 100, 100A and 100B shown in FIGS. 5, 7 and 8 and one of the conductive connection members 200, 200A and 200B shown in FIGS. 9 to 11, as shown in FIG. 4, a sealant 700 may be positioned at an edge of the solar cell module to prevent moisture from the outside from penetrating into the inside of the solar cell module. The sealant 700 may include a thermoplastic spacer (TPS) 710 attached to an inner surface of the front substrate 400 and an inner surface of the back substrate 500 and a silicone 720 that is attached to the inner surface of the front substrate 400 and the inner surface of the back substrate 500 and surrounds the thermoplastic spacer 710. The thermoplastic spacer 710 may include a moisture absorbent 711 therein.

Accordingly, the solar cell module may have a frameless structure that does not include a metal frame surrounding the peripheral edge of the solar cell module.

A solar cell module according to a second embodiment of the invention is described below with reference to FIG. 15.

Figure 15:
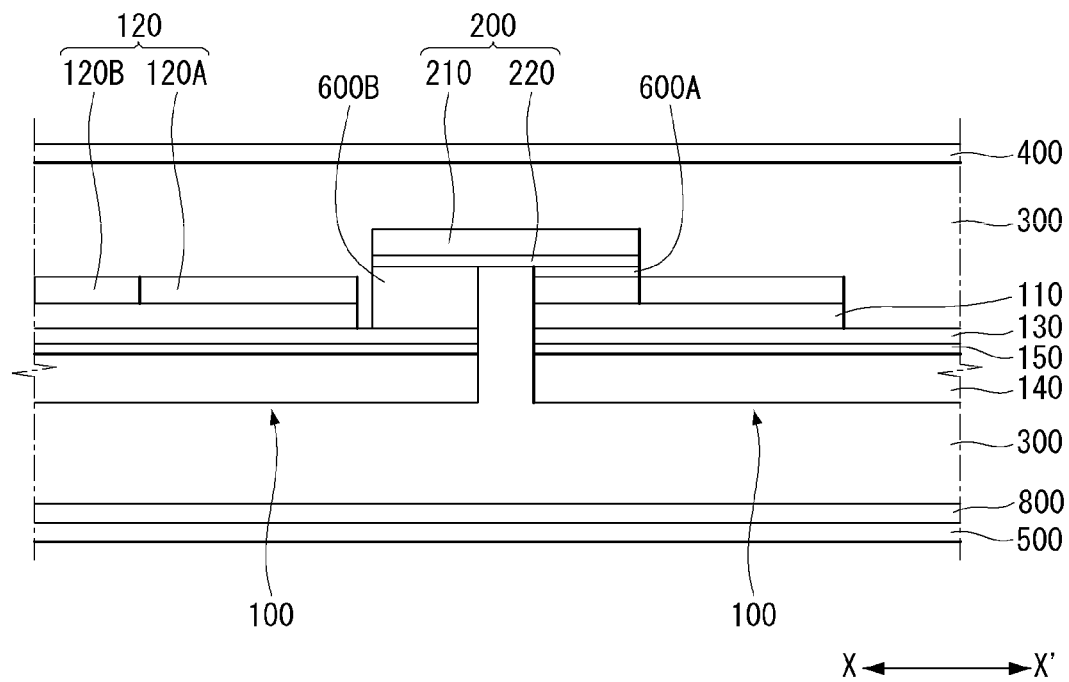
FIG. 15 is a cross-sectional view of a second direction enlargedly illustrating a main part of a solar cell module according to a second embodiment of the invention.

FIG. 15 is a cross-sectional view of a second direction enlargedly illustrating a main part of a solar cell module according to a second embodiment of the invention.

In the explanation of the second embodiment of the invention, structures and components identical or equivalent to the solar cell module according to the first embodiment are designated with the same reference numerals, and a further description may be briefly made or may be entirely omitted.

The solar cell module according to the second embodiment of the invention may use any one of the compound semiconductor solar cells 100, 100A and 100B shown in FIGS. 5, 7 and 8.

The solar cell module according to the second embodiment of the invention is substantially the same as the solar cell module according to the first embodiment of the invention, except that a light reflective coating layer 800 is additionally disposed on an inner surface of a back substrate 500.

The light reflective coating layer 800 reflects light incident on a space between compound semiconductor solar cells 100, that are adjacent to each other on different strings, toward a front substrate 400, thereby increasing an amount of light incident on the compound semiconductor solar cells 100.

Since the light reflective coating layer 800 performing the above-described operation may have a usual structure capable of light reflection, a detailed description thereof will be omitted.

A solar cell module according to a third embodiment of the invention is described below with reference to FIGS. 16 and 17.

Figure 16:
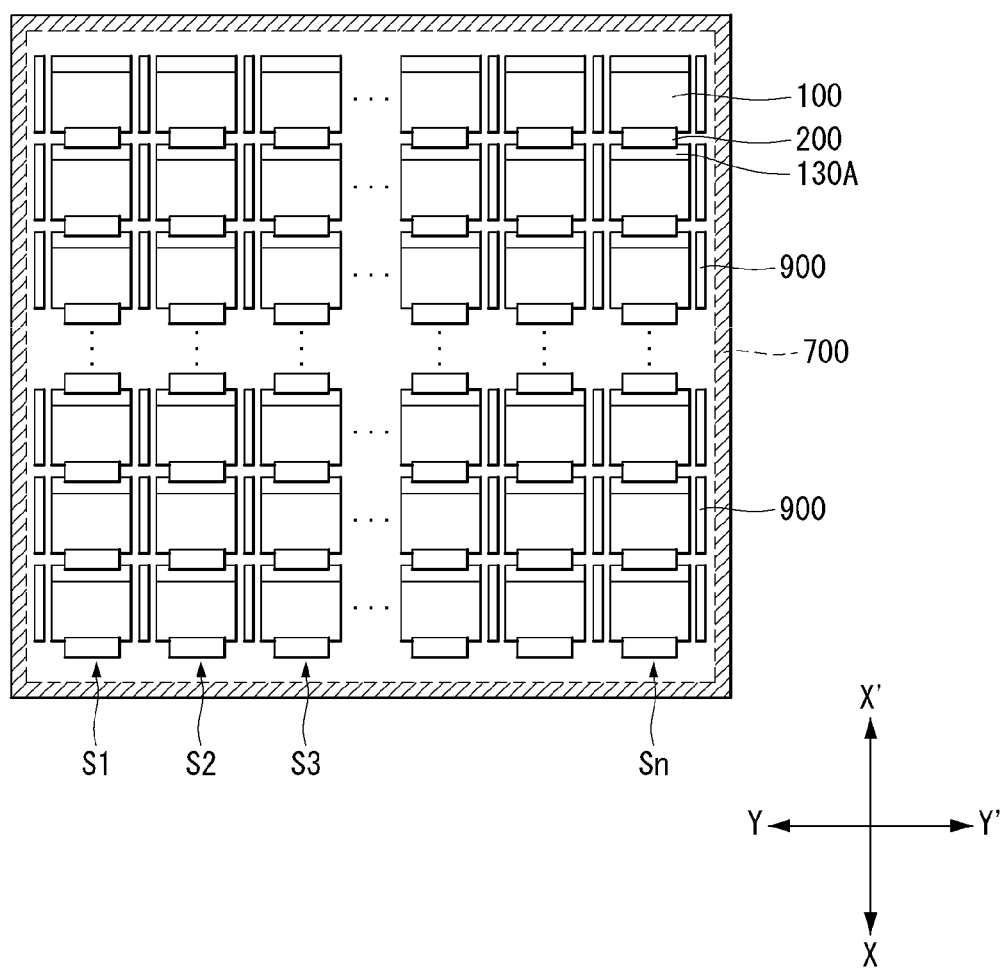
FIG. 16 is a plan view of a solar cell module according to a third embodiment of the invention.
Figure 17:
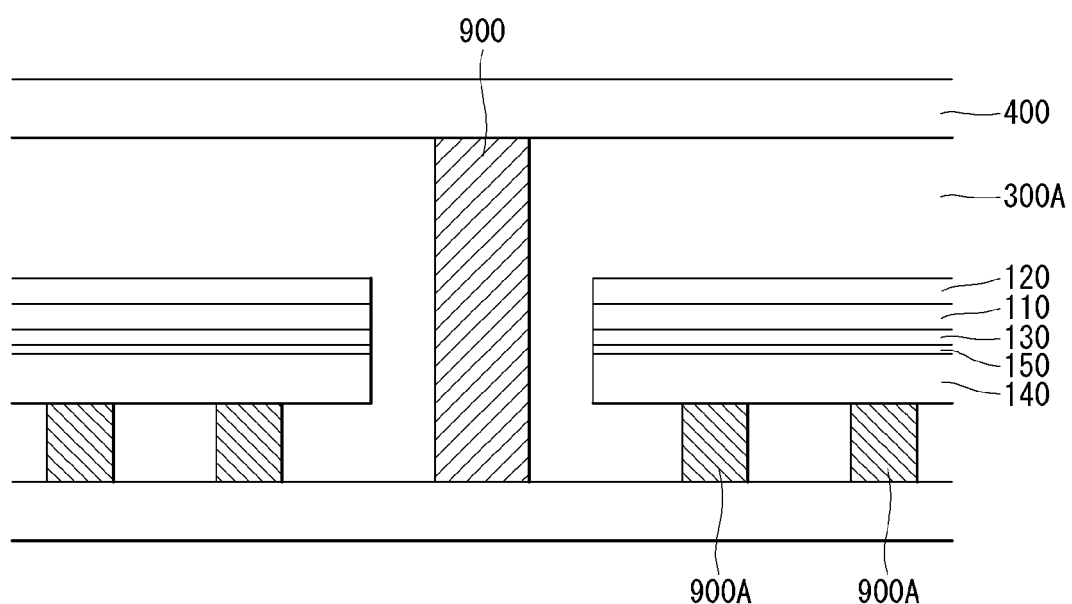
FIG. 17 is a cross-sectional view of a first direction illustrating a configuration of a main part of a solar cell module shown in FIG. 16.

FIG. 16 is a plan view of a solar cell module according to a third embodiment of the invention, and FIG. 17 is a cross-sectional view of a first direction illustrating a configuration of a main part of the solar cell module shown in FIG. 16.

The solar cell module according to the third embodiment of the invention is different from the solar cell module according to the first embodiment of the invention, in that a formation space of the encapsulant 300 is filled with air or an inert gas 300A, instead of the encapsulant 300 between the front substrate 400 and the back substrate 500 in the first embodiment, and a distance between the front substrate 400 and the back substrate 500 is maintained by a spacer 900. Both ends of the spacer 900 may be respectively attached to an inner surface of the front substrate 400 and an inner surface of the back substrate 500.

The spacer 900 may be positioned in a space between compound semiconductor solar cells, that are adjacent to each other on different strings, so that the electrical coupling between the adjacent compound semiconductor solar cells is not disturbed by the spacer 900.

As shown in FIG. 16, the plurality of spacers 900 may be positioned in a space between different strings in an island shape. Alternatively, one spacer 900 extended in the second direction X-X' may be positioned in a space between different strings.

Although not shown in FIG. 16, the spacers 900 may be positioned at an upper side (i.e., a space between compound semiconductor solar cells arranged on first lines of the strings and an edge of the solar cell module) of the solar cell module and a lower side (i.e., a space between compound semiconductor solar cells arranged on last lines of the strings and an edge of the solar cell module) of the solar cell module.

The plurality of compound semiconductor solar cells may be attached to the back substrate 500 by an adhesive 900A positioned on the inner surface of the back substrate 500 and may be spaced apart from the back substrate 500 by a predetermined distance.

The spacer 900 and the adhesive 900A may be formed of an insulating material or a conductive material, and may be formed of the same material as the thermoplastic spacer 710.

Although not shown, a light reflective coating layer may be additionally disposed on the inner surface of the back substrate 500.

As described above, the solar cell module, in which air or the inert gas 300A is filled instead of the encapsulant 300, can suppress a loss of light absorbed in the encapsulant 300.

A refractive index of the encapsulant 300 is approximately 1.5, and a refractive index of air or the inert gas 300A is approximately 1. Therefore, a difference in a refractive index between a compound semiconductor substrate 110 and air or the inert gas 300A in the solar cell module, in which air or the inert gas 300A is filled instead of the encapsulant 300, is greater than a difference in a refractive index between the compound semiconductor substrate 110 and the encapsulant 300 in the solar cell modules according to the above embodiments. Hence, a light loss can be further reduced.

As a result, an optical effect of the solar cell module, in which air or the inert gas 300A is filled instead of the encapsulant 300, is further improved compared to the above embodiments.

Figure 18:
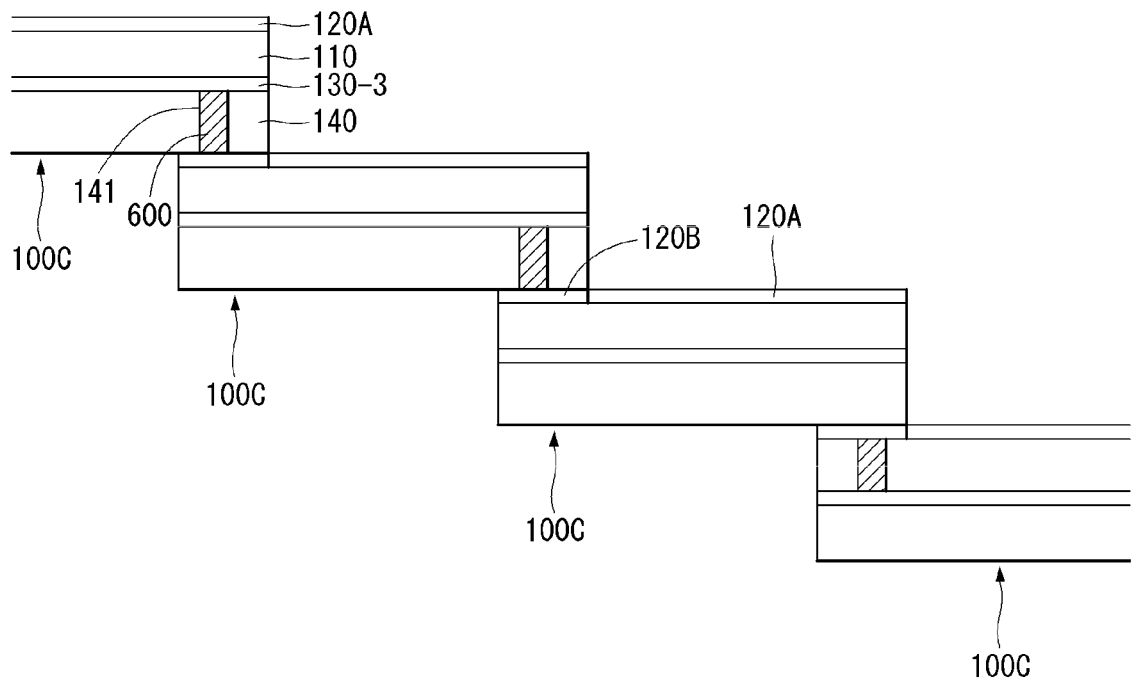
FIG. 18 is a cross-sectional view of a second direction illustrating an electrical coupling relationship between adjacent compound semiconductor solar cells in a solar cell module according to a fourth embodiment of the invention.
Figure 19:
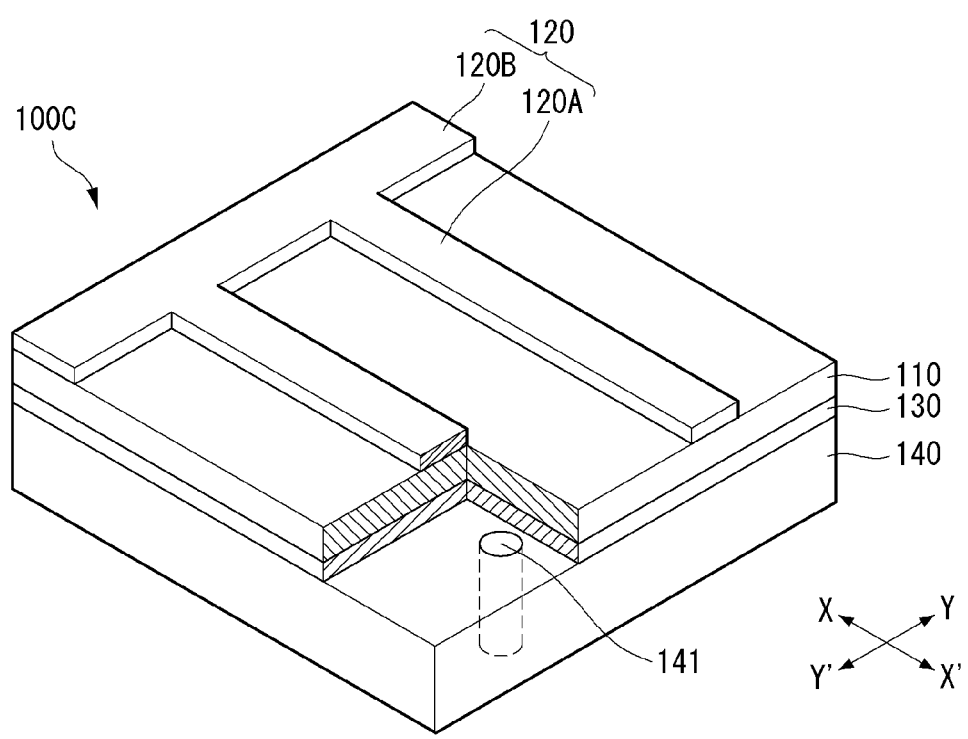
FIG. 19 is a perspective view of a compound semiconductor solar cell shown in FIG. 18.

A solar cell module according to a fourth embodiment of the invention is described below with reference to FIGS. 18 and 19.

In a compound semiconductor solar cell 100C used in the solar cell module according to the fourth embodiment of the invention, a second electrode part 130-3 does not include an extension, and a compound semiconductor substrate 110 and an insulating substrate 140 have the same size, unlike the compound semiconductor solar cells 100, 100A and 100B according to the above embodiments.

In the solar cell module including the compound semiconductor solar cell 100C, the insulating substrate 140 includes a through hole 141, and the through hole 141 is filled with a conductive adhesive 600.

The solar cell module according to the fourth embodiment of the invention is configured such that a tab portion 120B of a first electrode 120 of one compound semiconductor solar cell 100C overlaps a portion of a second electrode part 130 of another compound semiconductor solar cell 100C adjacent to the one compound semiconductor solar cell 100C on the projection plane.

Accordingly, two adjacent compound semiconductor solar cells 100C are connected in series to each other by electrically connecting a second electrode 130 of one compound semiconductor solar cell 100C to a tab portion 120B of a first electrode 120 of another compound semiconductor solar cell 100C adjacent to the one compound semiconductor solar cell 100C by the conductive adhesive 600 filled in the through hole 141.

The through hole 141 may be formed in a stripe shape extended along a longitudinal direction of the tab portion 120B, or may be locally formed along the longitudinal direction of the tab portion 120B.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of compound semiconductor solar cells, each compound semiconductor solar cell including:
an insulating substrate,
a compound semiconductor substrate that is attached on the insulating substrate by an insulating adhesive and that includes at least one light absorbing layer,
a first electrode part disposed on a first surface of the compound semiconductor substrate, and
a second electrode part disposed between a second surface of the compound semiconductor substrate and the insulating adhesive; and
a conductive connection member that electrically couples the first electrode part of a first compound semiconductor solar cell of the compound semiconductor solar cells to the second electrode part of a second compound semiconductor solar cell of the compound semiconductor solar cells by a conductive adhesive configured to fill a gap defined between the conductive connection member and the first electrode part or the second electrode part, the conductive connection member including an insulating base film and a conductive metal portion, wherein the conductive metal portion includes a bottom surface that directly contacts the conductive adhesive and that faces both of the first electrode part of the first compound semiconductor solar cell and the second electrode part of the second compound semiconductor solar cell, and wherein the conductive adhesive includes:

a first adhesive that directly contacts the bottom surface of the conductive metal portion and that is disposed between the bottom surface of the conductive metal portion and the first electrode part of the first compound semiconductor solar cell, the first adhesive having a first thickness, and a second adhesive that directly contacts the bottom surface of the conductive metal portion and that is disposed between the bottom surface of the conductive metal portion and the second electrode part of the second compound semiconductor solar cell, the second adhesive having a second thickness that is different from the first thickness.

2. The solar cell module of claim 1, wherein the conductive adhesive includes a low temperature curable paste, wherein the low temperature curable paste includes (i) a resin cured at a temperature of 180° C. or lower and (ii) a plurality of conductive particles in the resin, and wherein the resin includes an epoxy-based resin or a silicone-based resin, and the conductive particles include at least one of Ag, SnBi, Ni, and Cu.

3. The solar cell module of claim 1, wherein the insulating substrate includes:

a polymer having a thickness of 10 µm to 300 µm.

4. The solar cell module of claim 1, wherein a portion of the second electrode part extends outside of a perimeter of the compound semiconductor substrate by 0.1 mm to 5 mm.

5. The solar cell module of claim 1, wherein a width of the first adhesive is different from a width of the second adhesive.

6. The solar cell module of claim 5, wherein the conductive metal portion covers a first surface of the insulating base film.

7. The solar cell module of claim 6, wherein the insulating base film includes a light transmissive material, wherein the conductive metal portion includes a reflective metal layer, wherein the insulating base film includes at least one of polyethylene terephthalate (PET), polyimide (PI), or polyethylene naphthalate (PEN) and has a thickness of 50 µm to 300 µm, and wherein the reflective metal layer includes at least one of silver (Ag) or aluminum (Al).

8. The solar cell module of claim 5, further comprising:

a first substrate coupled to a first side of the plurality of compound semiconductor solar cells;

a second substrate coupled to a second side of the plurality of compound semiconductor solar cells; and an encapsulant that is located between the first substrate and the second substrate and that is configured to encapsulate the compound semiconductor solar cells; and a light reflective coating layer that is coupled to an inner surface of the second substrate.

9. The solar cell module of claim 5, further comprising:

a first substrate coupled to a first side of the plurality of compound semiconductor solar cells;

a second substrate coupled to a second side of the plurality of compound semiconductor solar cells; and an interior space between the first substrate and the second substrate, wherein the interior space is filled with air or an inert gas.

10. The solar cell module of claim 9, further comprising:

a spacer that is located between two adjacent compound semiconductor solar cells of the compound semiconductor solar cells to maintain a distance between the first substrate and the second substrate, wherein the compound semiconductor solar cells are coupled to an inner surface of the second substrate using an adhesive.

11. The solar cell module of claim 10, further comprising:

a light reflective coating layer that is coupled to the inner surface of the second substrate.

12. The solar cell module of claim 5, further comprising:

a first substrate coupled to a first side of the plurality of compound semiconductor solar cells;

a second substrate coupled to a second side of the plurality of compound semiconductor solar cells; and a sealant located at edges of the first substrate and the second substrate, wherein the sealant includes:

a thermoplastic spacer (i) that is coupled to an inner surface of the first substrate and an inner surface of the second substrate and (ii) that includes a moisture absorbent, and a silicone (i) that is coupled to the inner surface of the first substrate and the inner surface of the second substrate and (ii) that surrounds the thermoplastic spacer.

13. The solar cell module of claim 12, further comprising:

a light reflective coating layer that is coupled to the inner surface of the second substrate.

14. The solar cell module of claim 5, wherein the conductive metal portion includes a metal foil.

15. The solar cell module of claim 14, further comprising:

a first substrate coupled to a first side of the plurality of compound semiconductor solar cells;

a second substrate coupled to a second side of the plurality of compound semiconductor solar cells; and an encapsulant that is located between the first substrate and the second substrate and that includes at least one of polyethylene terephthalate (PET), polyolefin (PO), ionomer, polyvinyl butyral (PVB), or silicone; and a light reflective coating layer that is coupled to an inner surface of the second substrate.

16. The solar cell module of claim 14, further comprising:

a first substrate coupled to a first side of the plurality of compound semiconductor solar cells;

a second substrate coupled to a second side of the plurality of compound semiconductor solar cells; and an interior space between the first substrate and the second substrate, wherein the interior space is filled with air or an inert gas.

17. The solar cell module of claim 16, further comprising:

a spacer that is located between two adjacent compound semiconductor solar cells of the compound semiconductor solar cells to maintain a distance between the first substrate and the second substrate, wherein the compound semiconductor solar cells are coupled to an inner surface of the second substrate using an adhesive.

18. The solar cell module of claim 17, further comprising:
a light reflective coating layer that is coupled to the inner surface of the second substrate.

19. The solar cell module of claim 14, further comprising:
a first substrate coupled to a first side of the plurality of compound semiconductor solar cells;
a second substrate coupled to a second side of the plurality of compound semiconductor solar cells; and
a sealant located at edges of the first substrate and the second substrate, and
wherein the sealant includes:
- a thermoplastic spacer (i) that is coupled to an inner surface of the first substrate and an inner surface of the second substrate and (ii) that includes a moisture absorbent, and
- a silicone (i) that is coupled to the inner surface of the first substrate and the inner surface of the second substrate and (ii) that surrounds the thermoplastic spacer.

20. The solar cell module of claim 19, further comprising:
a light reflective coating layer that is coupled to the inner surface of the second substrate.

\* \* \* \* \*